(12) United States Patent
Pang et al.

(10) Patent No.: US 7,569,471 B2
(45) Date of Patent: Aug. 4, 2009

(54) METHOD OF PROVIDING MIXED SIZE SOLDER BUMPS ON A SUBSTRATE USING A SOLDER DELIVERY HEAD

(75) Inventors: Mengzhi Pang, Phoenix, AZ (US); John Guzek, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 158 days.

(21) Appl. No.: 11/479,625

(22) Filed: Jun. 29, 2006

(65) Prior Publication Data

US 2008/0003805 A1    Jan. 3, 2008

(51) Int. Cl.
     *H01L 21/44*    (2006.01)
(52) U.S. Cl. ............... 438/612; 438/613; 257/E21.508; 257/738; 257/779
(58) Field of Classification Search ......... 438/612–613; 257/734, E21.508, 738, 779; 29/743–745
See application file for complete search history.

(56) References Cited

U.S. PATENT DOCUMENTS

| | | | |
|---|---|---|---|
| 5,749,614 A | | 5/1998 | Reid |
| 5,985,694 A | * | 11/1999 | Cho ........................... 438/108 |
| 6,415,974 B2 | * | 7/2002 | Jao ............................. 228/215 |
| 2004/0127010 A1 | * | 7/2004 | Chen et al. .................. 438/612 |
| 2007/0069346 A1 | * | 3/2007 | Lin et al. ..................... 257/673 |

* cited by examiner

*Primary Examiner*—Ha Tran T Nguyen
*Assistant Examiner*—Daniel Whalen
(74) *Attorney, Agent, or Firm*—Blakely, Sokoloff, Taylor & Zafman LLP

(57) ABSTRACT

A method of providing electrically conductive bumps on electrode pads of a microelectronic substrate, and bumped substrate formed according to the method. The method includes: providing a substrate including first electrode pads and second electrode pads thereon, the first electrode pads exhibiting a first pattern, and the second electrode pads exhibiting a second pattern different from the first pattern; attaching first solder portions to a solder delivery head according to the first pattern, and second solder portions to a solder delivery head according to the second pattern, the second solder portions being larger than the first solder portions; after attaching, releasing the first solder portions onto the first electrode pads, and the second solder portions onto the second electrode pads; after releasing, reflowing the first solder portions and second solder portions to form, respectively, first solder bumps and second solder bumps on the electrode pads.

7 Claims, 6 Drawing Sheets

METHOD OF PROVIDING MIXED SIZE SOLDER BUMPS ON A SUBSTRATE USING A SOLDER DELIVERY HEAD

FIELD

Embodiments of the present invention relate generally to solder bump forming methods and solder bump forming apparatus for forming solder bumps on electrode pads.

BACKGROUND

There are a number of solder bump forming methods according to the prior art. According to a plating method, metal is deposited on electrode pads of a microelectronic substrate through plating to form bumps. In another method typically referred to as a stencil printing method, solder paste, typically including flux, is printed onto electrode pads of a microelectronic substrate through a patterned stencil, and then, after stencil removal, the device is heated to melt the solder to form bumps therefrom. Stencil printing is sometimes used by the prior art to deposit differing amounts of solder paste onto the electrode pads of a substrate as a function of a size of the solder resist opening on each of the electrode pads. Thus, the prior art sometimes uses a stencil mask exhibiting larger openings in registration with larger solder resist openings of the substrate, and smaller openings in registration with larger solder resist openings of the substrate, in this way depositing a corresponding amount of solder paste onto each electrode pad. However, it has been observed that the stencil printing method is not suited for high density interconnection structures, typically leading to missing bump rates, bump voiding, and bump height variation, thus negatively affecting die attachment yields.

Different techniques have been introduced to address ever growing demands for pitch and solder resist openings (SRO) size reductions, such as pitches of about 160 microns and SRO sizes of about 80 to 90 microns. One such method involves the placement of micro balls or micro spheres of solder onto the electrode pads of a microelectronic substrate. According to an attachment mounting micro ball placement method, solder balls are sucked into a jig by vacuum suction and the solder balls then mounted onto flux-coated electrode pads of a microelectronic substrate. Another micro ball placement method involves the use of a stencil mask. According to the latter methods, solder balls of a uniform size are dispensed onto a ball alignment plate or stencil mask including holes therein in registration with electrode pads of a microelectronic substrate. A squeegee brush is then used to disperse the balls and press them into the mask holes. The electrode pads include flux thereon, which allows the balls to adhere thereto. The stencil mask is removed after ball placement. The solder balls are then heated and melted to form bumps.

The prior art poses problems however, among others where bumps are to be provided on a substrate having electrode pads and/or solder resist openings of differing sizes. A micro ball placement method, such as the attachment mounting method or the stencil mask method described above, typically results in solder bumps exhibiting significant bump height variations from bump to bump depending on the size of the electrode pad and/or solder resist opening used.

The prior art fails to provide a reliable method of providing solder bumps on electrode pads and/or solder resist openings of differing sizes on a microelectronic substrate.

Figure 1:
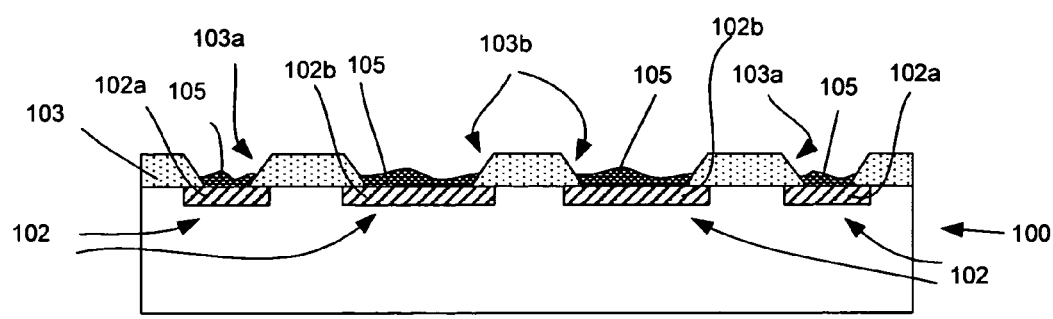
FIG. 1 is a schematic cross-sectional view of a substrate adapted to be provided with solder bumps according to a method embodiment.

For simplicity and clarity of illustration, elements in the drawings have not necessarily been drawn to scale. For example, the dimensions of some of the elements may be exaggerated relative to other elements for clarity. Where considered appropriate, reference numerals have been repeated among the drawings to indicate corresponding or analogous elements.

DETAILED DESCRIPTION

In the following detailed description, a method of providing solder bumps onto a microelectronic substrate is disclosed. Reference is made to the accompanying drawings within which are shown, by way of illustration, specific embodiments by which the present invention may be practiced. It is to be understood that other embodiments may exist and that other structural changes may be made without departing from the scope and spirit of the present invention.

The terms on, above, below, and adjacent as used herein refer to the position of one element relative to other elements. As such, a first element disposed on, above, or below a second element may be directly in contact with the second element or it may include one or more intervening elements. In addition, a first element disposed next to or adjacent a second element may be directly in contact with the second element or it may include one or more intervening elements.

In one embodiment, a method of placing solder bumps on electrode pads of a microelectronic substrate is disclosed. In another embodiment, a bumped microelectronic substrate is disclosed. By "electrode pads," what is meant in the context of the instant description are bumping sites on a microelectronic substrate, such as under-bump metallization layers or "surface finish" layers, which allow the device to be electrically connected to other devices. Aspects of this and other embodiments will be discussed herein with respect to FIGS.

1-8, below. The figures, however, should not be taken to be limiting, as they are intended for the purpose of explanation and understanding.

Figure 10:
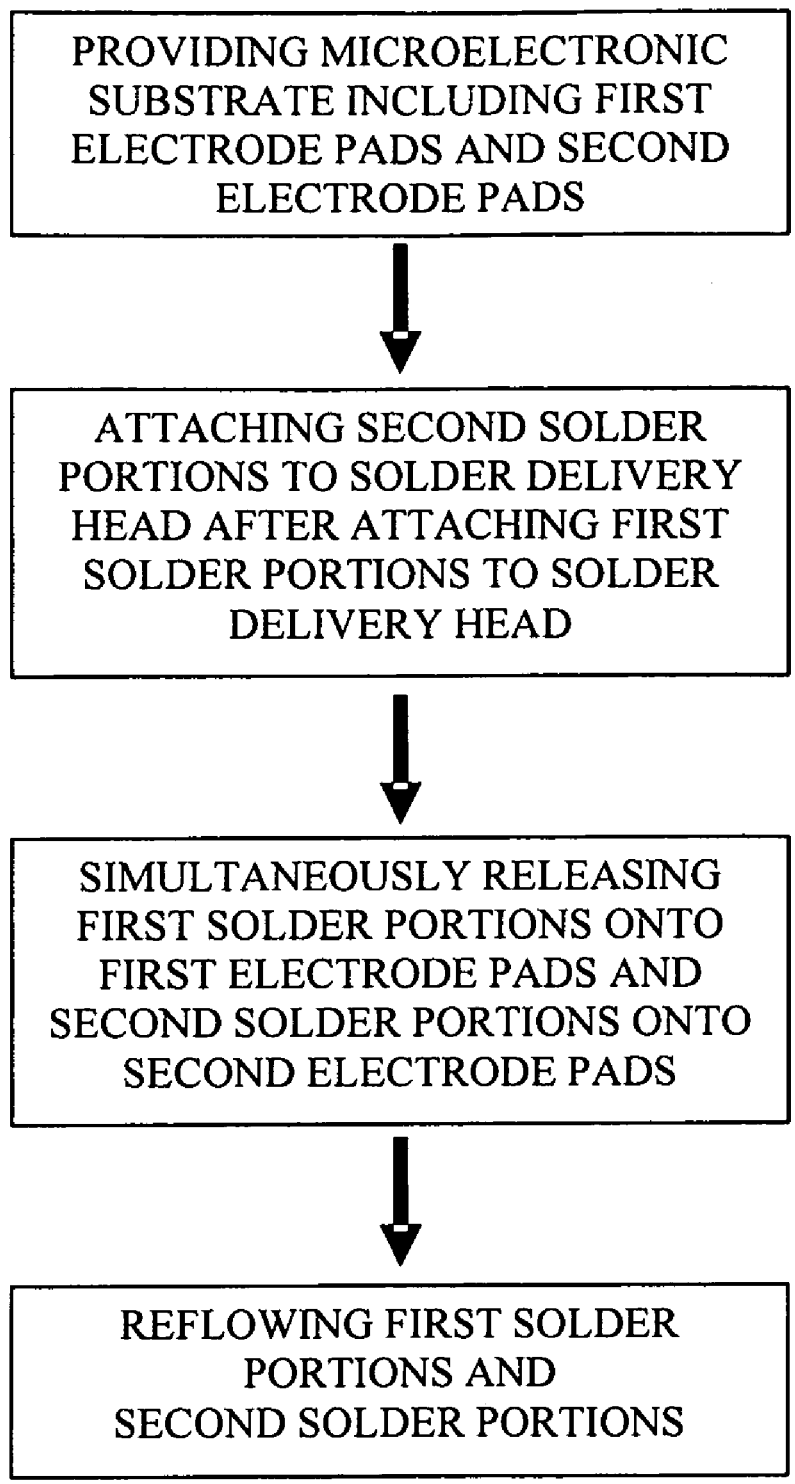
FIG. 10 is a flowchart of a method of providing solder bumps of mixed sizes on a substrate using a solder delivery head according to an embodiment.

FIG. 10 is a flowchart of a method of providing solder bumps of mixed sizes on a substrate using a solder delivery head according to an embodiment. Embodiments of the invention include providing a microelectronic substrate including first electrode pads and second electrode pads; attaching first solder portions to a solder delivery head and after attaching first solder portions, attaching second solder portions to the solder delivery head; after attaching, simultaneously releasing first solder portions onto first electrode pads and second solder portions onto second electrode pads; and after releasing, reflowing first solder portions and second solder portions. Referring now to FIG. 1 by way of example, a method embodiment comprises providing a microelectronic substrate including electrode pads thereon. By "microelectronic substrate", what is meant in the context of the instant description is a substrate onto which microelectronic conductive patterns have been provided. The substrate may include either the substrate a completed microelectronic device, or a substrate adapted to be further processed to form a microelectronic device, or a substrate, such as printed wiring board, including conductive patterns adapted to provide interconnection between microelectronic components. For exampleL the substrate can be an organic build-up substrate, a ceramic substrate, or a semiconductor substrate, such as a silicon substrate of a microelectronic die. As seen in FIG. 1, a method embodiment comprises providing a microelectronic substrate 100 including electrode pads 102 thereon. In the shown embodiments, the electrode pads 102 include first electrode pads 102a set according to a first pattern (in the shown embodiment, at the periphery of the substrate 100) and second electrode pads 102b according to a second pattern (in the shown embodiment, at a central region of the substrate 100), wherein the second electrode pads 102b are larger than the first electrode pads 102a. The substrate 100 therefore exhibits a mixed pad size configuration. It is note however, that embodiments are not limited to the use of a substrate having electrode pads of differing sizes, and includes within its scope a substrate having electrode pads of a substantially uniform size. Additionally, the pads may be set at differing or mixed pitches with respect to one another, or at a constant pitch, according to application needs. In the shown embodiment, pads 102 may include any well known type of surface finish on the substrate, such as, for example, under bump metallization including layers of gold and nickel as would be within the knowledge of a person skilled in the art. According to one embodiment, the substrate may include a solder resist layer 103 thereon. The solder resist layer 103 (also called a "solder mask" or "stop-off") is an insulating layer that is patterned with holes according to a pattern of the electrode pads. The solder resist may include a heat-resisting coating material applied to specific areas on the surface of a substrate, and is provided mainly as a protective film for the conductive patterns of the substrate. According to an embodiment, solder resist layer 103 may include a mixture of an epoxy resin and an acrylic resin, and may be coated onto the substrate in a well known manner. As shown, solder resist layer 103 may define first solder resist openings 103a therethrough placed in registration with corresponding ones of the electrode pads 102a, and second solder resist openings 103b therethrough placed in registration with corresponding ones of the electrode pads 102b. As shown, solder resist openings 103b are larger than solder resist openings 103a. The solder resist layer 103 in the shown embodiment therefore defines mixed solder resist openings therethrough, that is, solder resist openings of mixed sizes. It is noted that embodiments are not limited to the use of a substrate including a solder resist thereon, and include within their scope a processing of a substrate free of a solder resist layer. In the shown embodiment of FIG. 1, flux 105 is additionally shown as having been provided onto the electrode pads. The flux may include a flux having relatively high tackiness, and may be applied onto the pads in any well known manner, such as, for example, by way of stencil printing through a stencil mask (not shown).

Figure 2:
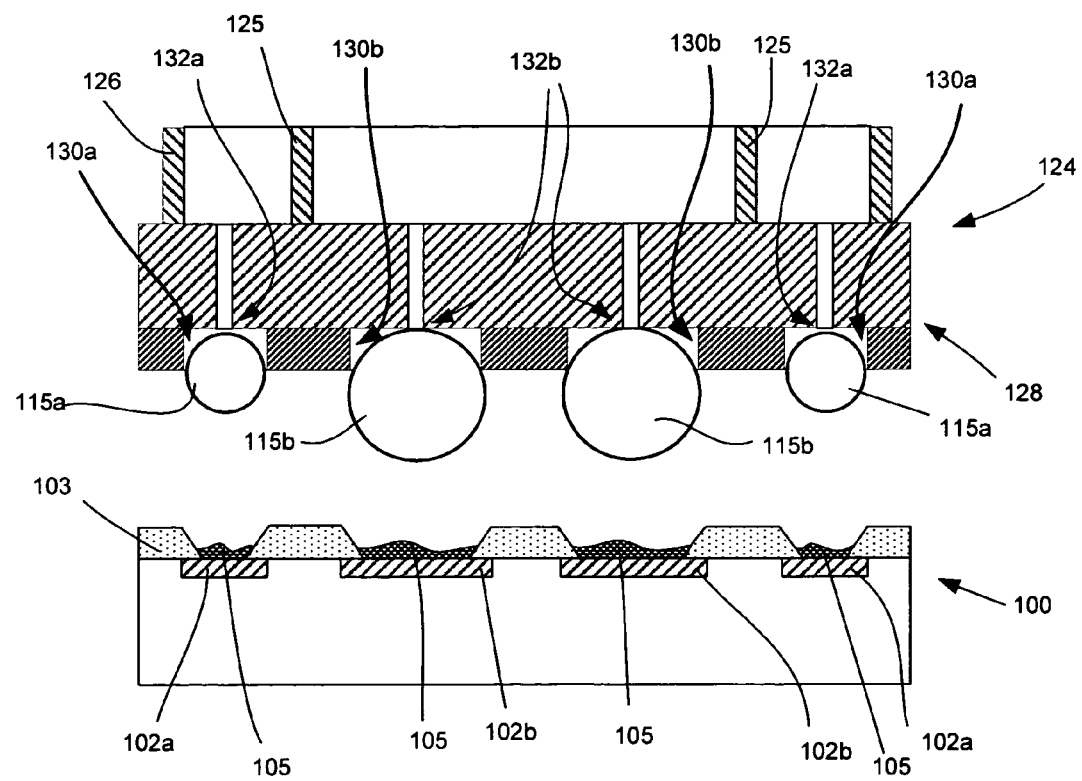
FIG. 2 is a schematic view showing solder balls of mixed sizes in the process of being provided onto the substrate of FIG. 1 according to a first method embodiment.
Figure 3:
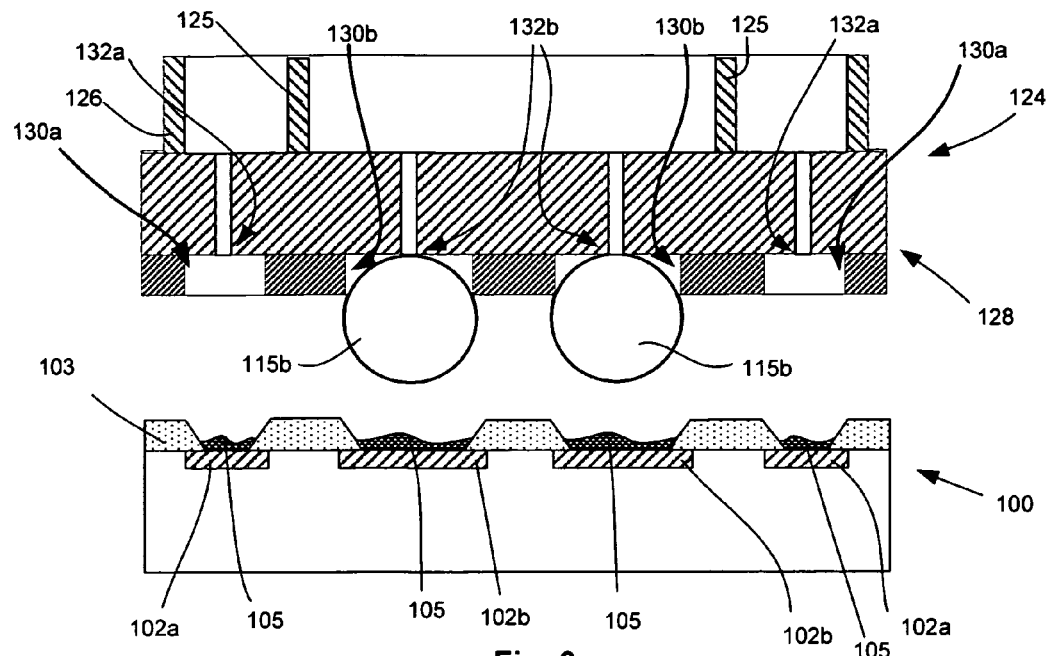
FIGS. 3 and 4 are a schematic view showing solder balls of mixed sizes in the process of being provided onto the substrate of FIG. 2 according to a second method embodiment.
Figure 4:
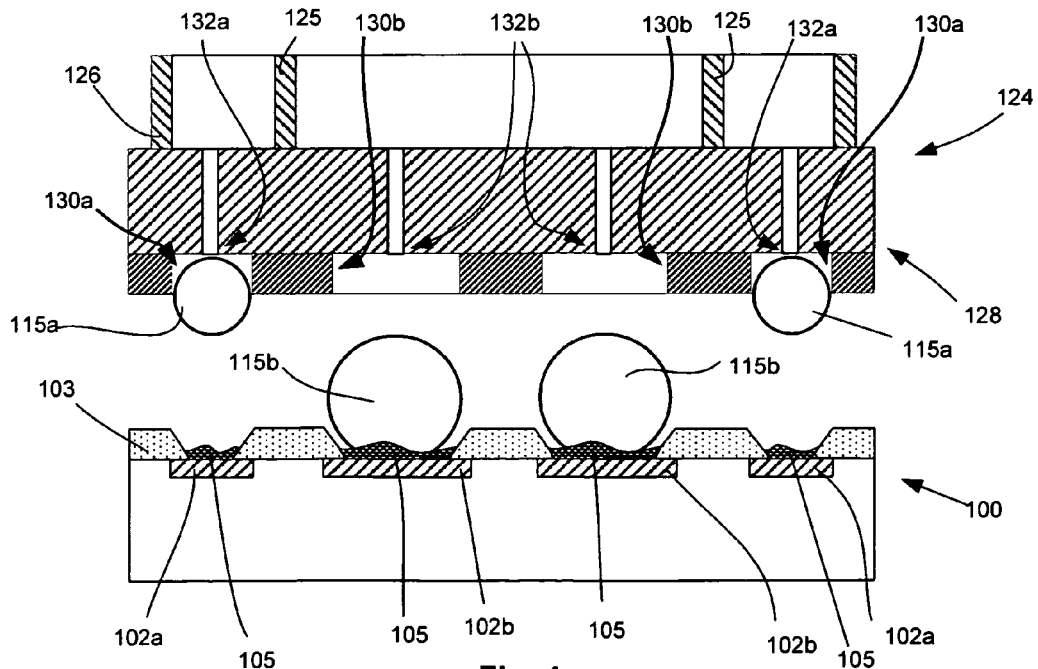

Referring next to FIGS. 2-4 by way of example, method embodiments comprise attaching first solder portions to a solder delivery head according to the first pattern (i.e. the pattern of the first electrode pads) and second solder portions to a solder delivery head according to the second pattern (i.e. the pattern of the second electrode pads). According to the shown embodiments, first solder portions comprise solder balls 115a, and second solder portions comprise solder balls 115b, solder balls 115b being larger than solder balls 1115a. In addition, in the shown embodiments, the solder delivery head is a single solder delivery head in the form of a vacuum head 124 as will be described further below, although embodiments are not so limited. While the embodiment of FIG. 2 depicts a method where the first and second solder balls are placed onto the electrode pads simultaneously with a single solder delivery head, the embodiment of FIGS. 3 and 4 depicts a method where the first and second solder balls are placed sequentially onto the electrode pads also with a single solder delivery head. Embodiments, however, also comprise within their scope the use of multiple solder delivery heads to hold and release solder portions of varying sizes. The solder delivery head in FIGS. 2-4, according to a preferred embodiment, comprises vacuum head 124 including a vacuum chuck 126 attached to a stencil 128. The stencil, as also seen in the bottom plan view of FIG. 5, defines first suction sites 130a exhibiting the first pattern and second suction sites 130b exhibiting the second pattern. The suction sites 130a and 130b may, according to an embodiment, be defined by respective depressions in a stencil 128, and may have a configuration adapted to hold corresponding ones of the solder balls 115a and 115b therein by virtue of an activation of those suction sites using suction. Thus, suctions sites 130a and 130b may be activated using suction through the vacuum chuck 126 and through respective suction apertures 132a and 132b. According to one embodiment (now shown), the suction sites may have a shape complimentary to a shape of the solder spheres they are adapted to therein. The vacuum may be achieved by any conventional technique. A low-level vacuum provided by a mechanical pump would, for example, be sufficient to hold the relatively lightweight solder balls. The stencil may, by way of example, be made of stainless steel, plastic or other organic resin materials. Attaching according to an embodiment may involve first activating the second suction sites 130b to hold second solder balls 115b therein. Optionally then, the stencil 128 may be vibrated in a well known manner while suction sites 130b are activated in order to remove an excess of the second solder balls 115b from stencil 128. Thereafter, attaching may involve activating the first suction sites 130a to hold first solder balls 115a therein. Again, optionally, the stencil 128 may be vibrated in a well known manner while suction sites 130a are activated in order to remove an excess of the first solder balls 115a from stencil 128. Thus, according to an embodiment, the vacuum head 124 may be configured such that the suction sites 130a and 130b are independently activatable with respect to one another in order to allow an independent attachment of, respectively, first solder balls 115a and second solder balls 115b thereto. For example, as seen in FIGS. 2-4, the vacuum chuck 126 may include partitioning walls 125 therein in order to allow an application of vacuum to suctions sites 130a and 130b independently of one another. Referring to the first embodiment of FIG. 2, attaching may comprise attaching both the first solder balls 115a and the second solder balls 115b to the vacuum head 124 before releasing the solder balls onto the substrate. However, as shown in FIGS. 3 and 4, according to a second embodiment, attaching may comprise first releasing the second solder balls 115b before attaching and releasing the first solder balls 115a. In the alternative (not shown), embodiments also include within their scope an initial attachment of the first solder balls 115a, followed by a release thereof, before a subsequent attachment and release of the second solder balls 115b.

Referring now to FIGS. 2-5, method embodiments further comprise, after attaching as described above, releasing the first solder portions onto the first electrode pads, and the second solder portions onto the second electrode pads. FIG. 6 shows a schematic view of the substrate 100 after first solder balls 115a and second solder balls 115b have been released thereon according to an embodiment. Where, according to some embodiments, as shown in FIGS. 2-6, the solder delivery head includes a single device in the form of a vacuum head, such as vacuum head 124, then releasing may include de-activating the first suction sites 130a and second suction sites 130b by stopping suction to release, respectively, the first solder portions 115a and the second solder portions 115b. Thus, referring first to the embodiment of FIG. 2 and 6 by way of example, one embodiment envisages releasing the first solder balls 115a and second solder balls 115b simultaneously by simultaneously de-activating suction through the first suction sites 130a and second suction sites 130b to release the solder balls onto corresponding ones of the electrode pads. Referring now to the embodiment of FIGS. 3-6 by way of example, a second embodiment envisages releasing the second solder balls 115b first by first de-activating suction through the second suction sites 130b, and thereafter releasing the first solder balls 115a by de-activating suction through the first suctions sites 130a. Embodiments also comprise within their scope a method embodiment where the first solder balls 115a and second solder balls 115b are held simultaneously onto the vacuum head 124, but released in succession in any order to yield the configuration of FIG. 6. To the extent that the suction sites 130a and 130b on the vacuum stencil 128 correspond to the pattern of electrode pads 102a and 102b on the substrate 100, releasing may comprise, as shown in the embodiments of FIGS. 2-4, positioning the vacuum head 124 onto the substrate 100 such that the first suction sites 130a and second suction sites 130b are above and in registration with, respectively, the first electrode pads 102a and the second electrode pads 102b. In this way, a de-activation of the suction sites 130a and 130b would ensure a landing of the solder balls 115a and 115b on the corresponding electrode pad. According to one embodiment, the vacuum head 124 may be moved such that the solder portions held thereon contact their corresponding electrode pads prior to being released thereon. Optionally, according to one embodiment, flux may be provided onto the electrode pads in a well known manner prior to a placement of solder portions onto the substrate. Thus, as depicted in the figures, flux 105 is shown as having been provided onto the electrode pads 102a and 102b. According to another embodiment, releasing may comprise reverse flowing a gas through the respective apertures of the vacuum head in order to facilitate a release of solder portions therefrom. Thus, according to one embodiment, the vacuum head 124 may be configured such that the suction heads 130a and 130b are not only adapted to apply suction to solder balls 115a and 115b, respectively, but also to apply a reverse gas flow, such as a reverse flow of nitrogen gas, thereto in order to release the same into corresponding ones of the electrode pads 102a and 102b. A reverse flow of gas may thus be applied to the vacuum head 124 according to one embodiment in order to purge the same of solder balls 115a or 115b. Similarly to the application of suction, the vacuum head may be configured to apply a reverse gas flow to suction sites 130a and 130b independently of one another, for example by virtue of the presence of partitions 125. The placement of solder balls 115a and 115b onto substrate 100 results in the formation of an intermediate structure 122 as shown in FIG. 6.

Although the embodiments of FIGS. 2-4 depict the use of a single vacuum head as a solder delivery head, it is noted that embodiments are not so limited, and include within their scope the use of, for example, multiple solder delivery heads to place solder portions onto a substrate having electrode pads of differing sizes, each solder delivery head being adapted, for example, to deliver solder portions of a specific size, or solder portions according to a specific pattern, as a function of application needs. In addition, embodiments are not limited to the use of a vacuum head as a solder delivery head, and include within their scope the use of any configuration of a solder delivery head adapted to hold solder portions thereon, and to release the solder portions onto mixed size electrode pads of a substrate.

Preferably, an embodiment comprises selecting respective sizes of the first solder portions and the second solder portions to achieve first solder bumps and second solder bumps having respective predetermined bump heights. Thus, for example, according to an embodiment, a size of first solder balls 115a and a size of second solder balls 115b may be selected such that, after reflow, bumps resulting from first solder balls 115a have a first predetermined bump height, and bumps resulting from second solder balls 115b have a second predetermined bump height. Most preferably, as suggested by FIG. 8 (to be discussed infra), the size of first solder balls 115a and the size of second solder balls 115b is selected such that bumps resulting from respective ones of the solder balls 115a and 115b have substantially identical bump heights, that is, such that the first and second predetermined bump heights are substantially identical. A correlation between solder ball size and bump height may, for example, be empirically determined for a given solder resist opening size and configuration. For example, for a given solder resist opening size and configuration, an observation may be made as to a correlation between the respective solder bumps obtained from solder balls of differing sizes. In this way, a determination may be made as to a target solder ball size adapted to generate a solder bump of a desired height for a given solder resist opening size and configuration.

Figure 7:
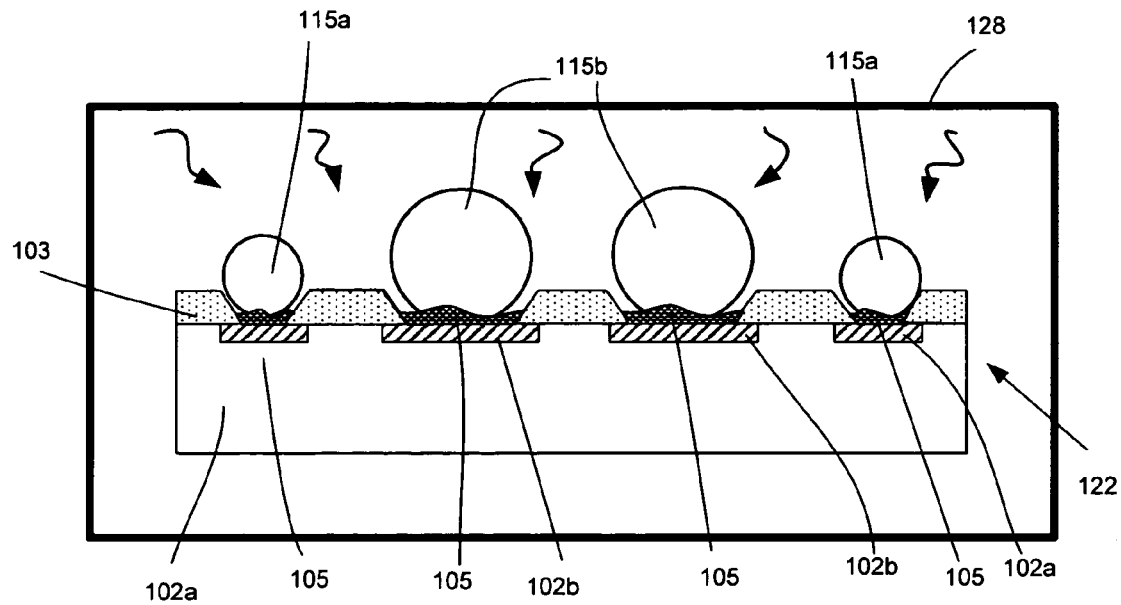
FIG. 7 is a schematic view of the intermediate structure of FIG. 4 as undergoing reflow in a reflow oven according to a method embodiment.

Referring now to FIG. 7 by way of example, embodiments include reflowing the solder portions to form solder bumps on respective ones of the electrode pads. Thus, as seen in FIG. 7, the intermediate structure 122 of FIG. 5 may be placed in a reflow oven 129 as shown. The reflow may take place at reflow temperatures suitable for the intermediate structure 122 and for the solder balls 115a and 115b, as would be recognizable to one skilled in the art. According to an embodiment, reflow may take place at temperatures above about 250 degrees Centigrade. The 250 degrees Centigrade minimum reflow temperature would for example apply to solder balls comprising a SnAg or a SnAgCu alloy. The SnAg may comprise less than about 4% by weight Ag, while the SnAgCu may comprise less than about 1% by weight Cu and less than about 4% by weight Ag.

Figure 5:
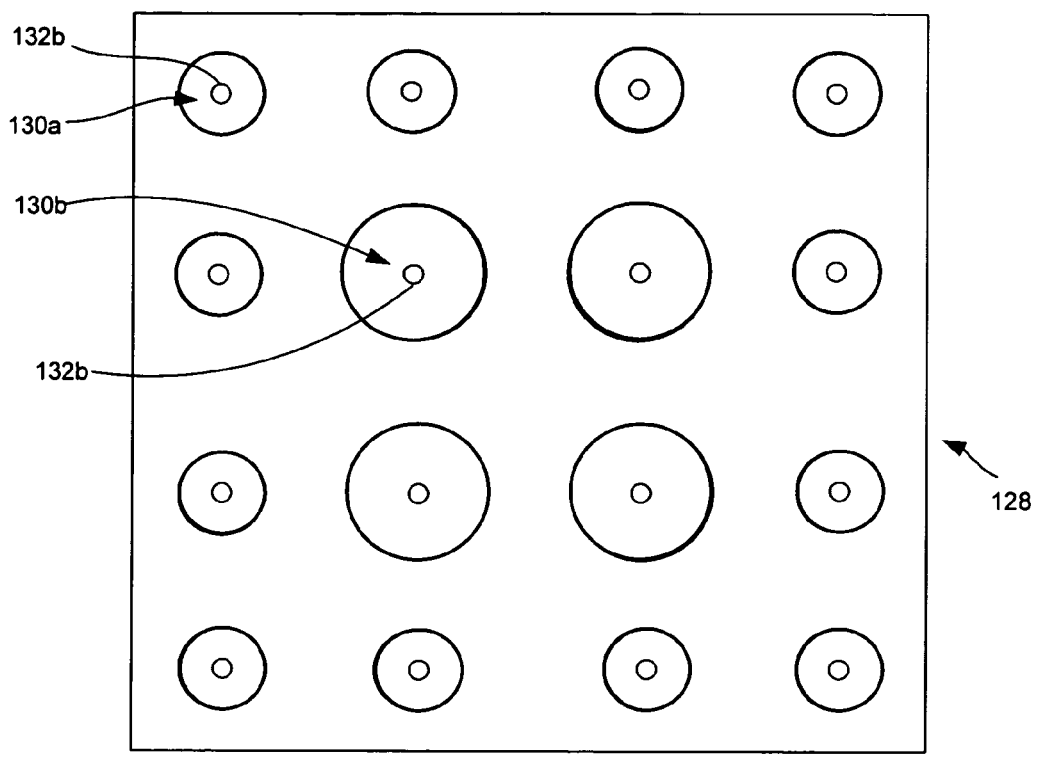
FIG. 5 is a schematic bottom plan view of a vacuum head such as the vacuum head shown in FIG. 2 according to an embodiment.
Figure 6:
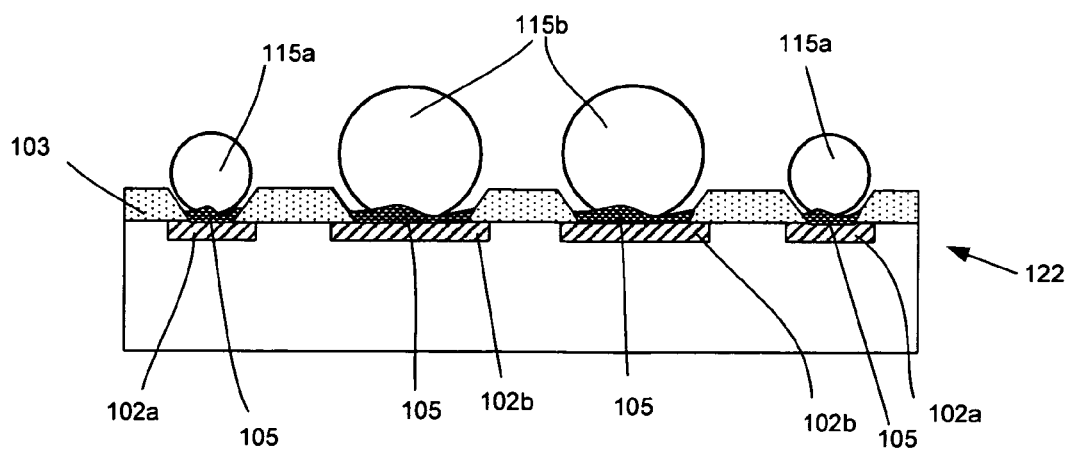
FIG. 6 is a schematic view of an intermediate structure obtained from placed mixed size solder balls onto the substrate of FIG. 1 according to an embodiment.
Figure 8:
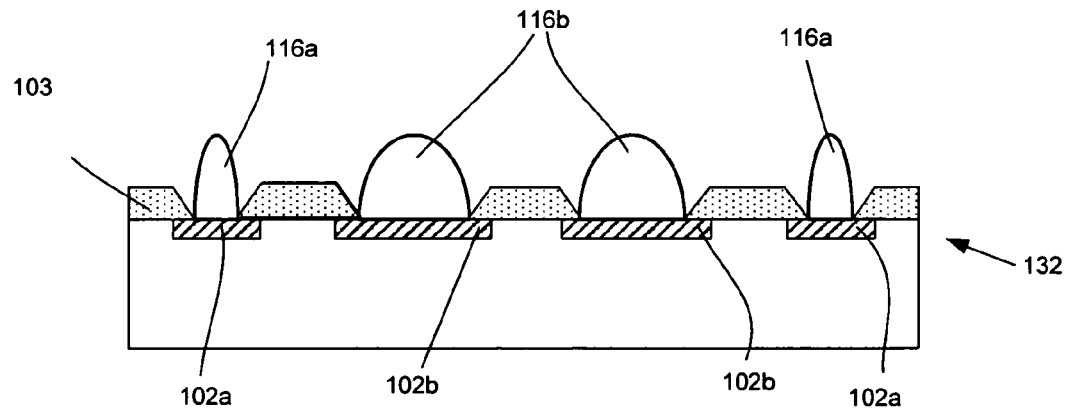
FIG. 8 is a schematic view of a bumped substrate obtained by practicing a method embodiment.

As seen in FIG. 8, a reflowing of the intermediate package 122 of FIG. 5 as shown in FIG. 6 results in the formation of solder bumps 116a and 116b, corresponding to balls 115a and 115b, respectively, onto electrode pads 102a and 102b of substrate 100, yielding a solder-bumped substrate 132 as shown. In the shown embodiment, the solder-bumped substrate 132 includes the plurality of electrode pads 102a and 102b, first solder bumps 116a and second solder bumps 116b on corresponding ones of the electrode pads 102a and 102b, bumps 116b being larger than bumps 116a, and bumps 116a and 116b having substantially identical heights. Solder bumps have "substantially identical heights" as described therein where their respective heights are within bump height variation tolerances according to application needs. Thus, a given application may specify a requirement for substrates having bump heights of 30 microns with tolerances of +/−15 microns. In such a case, solder bumps as described herein would have "substantially identical heights" where their heights would range from between 15 microns up to 45 microns. In the alternative, if the tolerances specified were +/−5 microns, then, solder bumps as described herein would have "substantially identical heights" where their heights would range from between 25 microns and 35 microns. The bumped substrate 132 as shown further includes the solder resist layer 103 thereon, although, as noted previously, embodiments are not limited to the use of a substrate including a solder resist layer.

Advantageously, method embodiments allow for a more precise solder bump volume and height control by virtue of allowing a placement of mixed size solder portions onto electrode pads of a substrate. The more precise bump volume and height control allows a more reliable formation of solder joints during chip attachment, and thus results in a significantly lower amount of solder voids, missing bumps and resulting electromigration issues as compared with the prior art.

Figure 9:
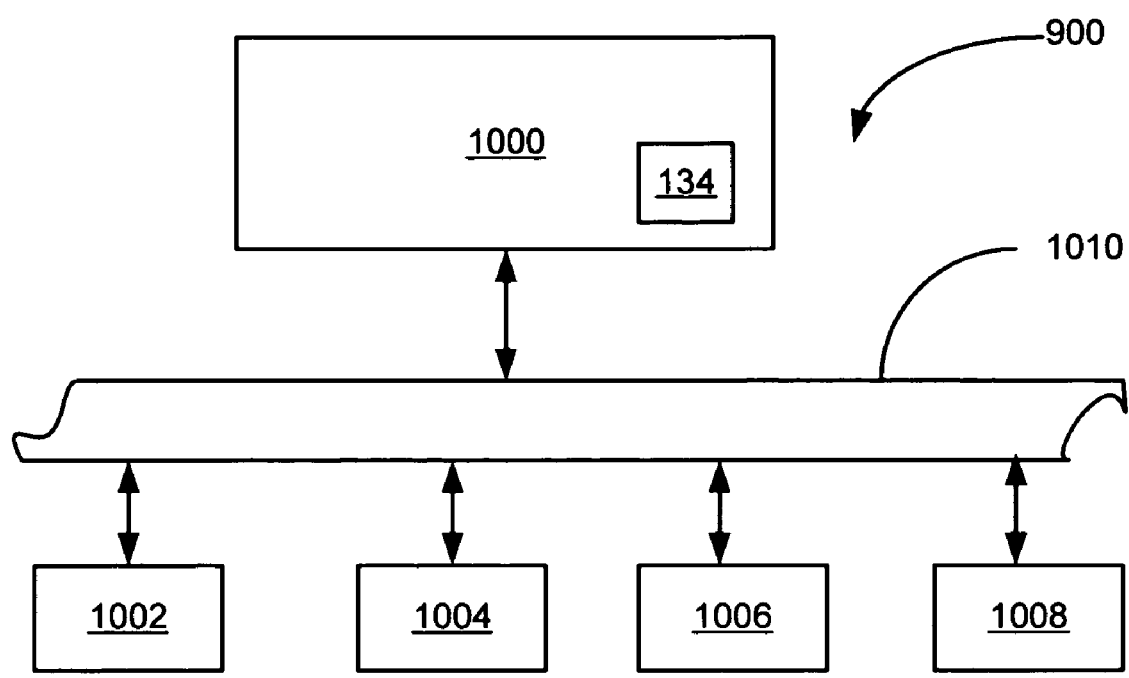
FIG. 9 is a schematic view of a system including a bumped microelectronic substrate according to an embodiment.

Referring to FIG. 9, there is illustrated one of many possible systems 900 in which embodiments of the present invention may be used. In one embodiment, the electronic assembly 1000 may include a microelectronic package 134 including a solder-bumped substrate, such as substrate 132 of FIG. 8. Assembly 1000 may further include a microprocessor. In an alternate embodiment, the electronic assembly 1000 may include an application specific IC (ASIC). Integrated circuits found in chipsets (e.g., graphics, sound, and control chipsets) may also be packaged in accordance with embodiments of this invention.

For the embodiment depicted by FIG. 9, the system 900 may also include a main memory 1002, a graphics processor 1004, a mass storage device 1006, and/or an input/output module 1008 coupled to each other by way of a bus 1010, as shown. Examples of the memory 1002 include but are not limited to static random access memory (SRAM) and dynamic random access memory (DRAM). Examples of the mass storage device 1006 include but are not limited to a hard disk drive, a compact disk drive (CD), a digital versatile disk drive (DVD), and so forth. Examples of the input/output module 1008 include but are not limited to a keyboard, cursor control arrangements, a display, a network interface, and so forth. Examples of the bus 1010 include but are not limited to a peripheral control interface (PCI) bus, and Industry Standard Architecture (ISA) bus, and so forth. In various embodiments, the system 90 may be a wireless mobile phone, a personal digital assistant, a pocket PC, a tablet PC, a notebook PC, a desktop computer, a set-top box, a media-center PC, a DVD player, and a server.

The various embodiments described above have been presented by way of example and not by way of limitation. Having thus described in detail embodiments of the present invention, it is understood that the invention defined by the appended claims is not to be limited by particular details set forth in the above description, as many variations thereof are possible without departing from the spirit or scope thereof.

What is claimed is:

1. A method of providing electrically conductive bumps on electrode pads of a microelectronic substrate comprising:
providing a microelectronic substrate including first electrode pads and second electrode pads thereon, the first electrode pads exhibiting a first pattern, and the second electrode pads exhibiting a second pattern different from the first pattern;
attaching first solder portions to a solder delivery head according to the first pattern, and after attaching said first solder portions, attaching second solder portions to the solder delivery head according to the second pattern, the second solder portions being a different size than the first solder portions;
after attaching, simultaneously releasing the first solder portions onto the first electrode pads and the second solder portions onto the second electrode pads;
after releasing, reflowing the first solder portions and second solder portions to form, respectively, first solder bumps and second solder bumps on respective ones of the first electrode pads and the second electrode pads.

2. The method of claim 1, wherein reflowing the first solder portions and reflowing the second solder portions occur simultaneously.

3. The method of claim 1, further comprising, prior to providing the first solder portions and the second solder portions, adding flux to the electrode pads.

4. The method of claim 1, wherein the first solder portions and the second solder portions comprise solder balls.

5. The method of claim 1, wherein the substrate comprises a solder resist layer thereon, the solder resist layer defining first solder resist openings therethrough placed in registration with the first electrode pads, and second solder resist openings therethrough placed in registration with the second electrode pads, the second solder resist openings being larger than the first solder resist openings.

6. The method of claim 1, further comprising selecting respective sizes of the first solder portions and the second solder portions to achieve first solder bumps and second solder bumps having respective predetermined bump heights.

7. The method of claim 1, wherein the respective predetermined bump heights are substantially identical heights.

* * * * *